United States Patent
Park et al.

(10) Patent No.: US 7,691,718 B2
(45) Date of Patent: Apr. 6, 2010

(54) DUAL LAYER HARD MASK FOR BLOCK SALICIDE POLY RESISTOR (BSR) PATTERNING

(75) Inventors: Joodong Park, Portland, OR (US); Chia-Hong Jan, Portland, OR (US); Paul Reese, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 118 days.

(21) Appl. No.: 12/005,944

(22) Filed: Dec. 27, 2007

(65) Prior Publication Data

US 2009/0170273 A1 Jul. 2, 2009

(51) Int. Cl.
*H01L 21/20* (2006.01)

(52) U.S. Cl. .............. 438/382; 257/E21.006

(58) Field of Classification Search .......... 438/382, 438/384; 257/E21.006
See application file for complete search history.

(56) References Cited

U.S. PATENT DOCUMENTS

| | | | |
|---|---|---|---|
| 6,228,714 B1 * | 5/2001 | Choi .......................... 438/258 |
| 6,261,915 B1 * | 7/2001 | Eklund et al. ............... 438/384 |
| 6,300,180 B1 * | 10/2001 | Chang et al. ................ 438/210 |
| 6,844,228 B2 * | 1/2005 | Komori ....................... 438/238 |
| 2008/0237661 A1 * | 10/2008 | Ranade et al. .............. 257/288 |

\* cited by examiner

*Primary Examiner*—W. David Coleman
(74) *Attorney, Agent, or Firm*—Ryder, Lu, Mazzeo and Konieczny, LLC; Douglas J. Ryder

(57) ABSTRACT

In general, in one aspect, a method includes forming a semiconductor substrate having an N+ diffusion region, a shallow trench isolation (STI) region adjacent to the N+ diffusion region, and a blocked salicide poly resistor (BSR) region over the STI region. An oxide layer is over the substrate. A nitride layer is formed over the oxide layer and is annealed. A resist layer is patterned on the annealed nitride layer, wherein the resist layer covers a portion of the BSR region. The annealed nitride layer is etched using the resist layer as a pattern. The resist layer is removed and the oxide layer is etched using the annealed nitride layer as a pattern. Germanium pre-amorphization is implanted into the substrate, wherein the oxide and the annealed nitride layers protect a portion of the BSR region from the implanting.

13 Claims, 3 Drawing Sheets

DUAL LAYER HARD MASK FOR BLOCK SALICIDE POLY RESISTOR (BSR) PATTERNING

BACKGROUND

Blocked salicide poly resistor (BSR) patterning utilizes resist material during germanium pre-amorphization implant (GPI) to protect the BSR from the implant damage. The exposure of the resist material during GPI results in an interaction between the resist and the GPI that generates carbon knock-on. The carbon knock-on results in degradation in performance of N+ salicide regions in the substrate.

BRIEF DESCRIPTION OF THE DRAWINGS

The features and advantages of the various embodiments will become apparent from the following detailed description in which.

DETAILED DESCRIPTION

In order to reduce or eliminate the effect of carbon knock-on a blocking stack that does not include resist material is utilized. The blocking stack may be made of a plurality of materials (e.g., oxide, nitride) with each layer being deposited sequentially. An upper layer may be annealed so that it can act as a hard mask. The upper layer may be etched using a resist as a pattern, and after removal of the resist the lower layer can be etched using the upper layer as a hard mask. The patterned blocking stack (e.g., nitride/oxide) can protect the BSR poly from the GPI without the use of a resist layer. Accordingly, n+ salicide degradation caused by carbon knock-on can be effectively eliminated. FIGS. 1-8 illustrate an example process to create a blocking stack for GPI protection that does not include a resist layer and effectively eliminates creation of carbon knock-on.

Figure 1:
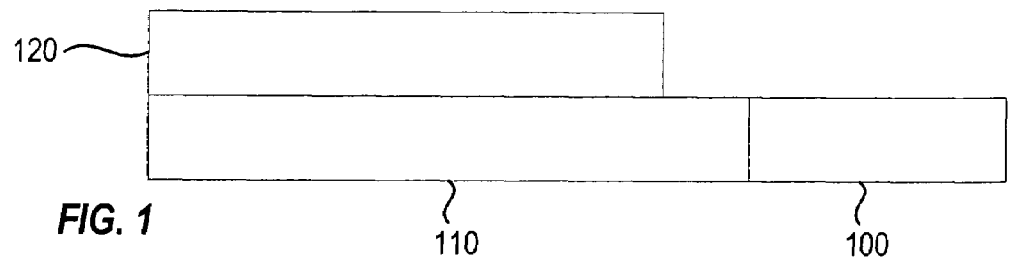
FIG. 1 illustrates an example substrate having a N+ diffused region, a shallow trench isolation (STI) region, and a blocked salicide poly resistor (BSR) layer, according to one embodiment.

FIG. 1 illustrates an example substrate having a N+ diffused region 100, a shallow trench isolation (STI) region 110 adjacent to the N+ diffused region 100, and a blocked salicide poly resistor (BSR) layer 120 over the STI region 110. The N+ diffused region 100, the STI region 110, and the BSR layer 120 making up the example substrate may be formed through any number of known processes.

Figure 2:
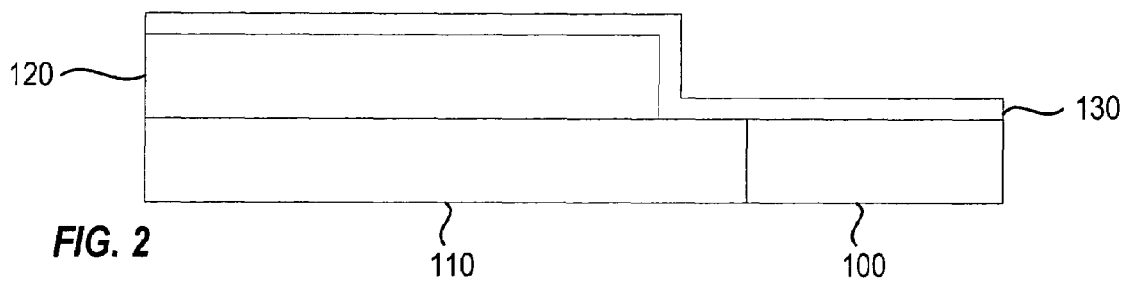
FIG. 2 illustrates the example substrate after a first masking layer is formed thereover, according to one embodiment.

FIG. 2 illustrates the example substrate after a first masking layer 130 (e.g., oxide) is formed thereover. The oxide layer 130 may be formed through any number of known processes.

Figure 3:
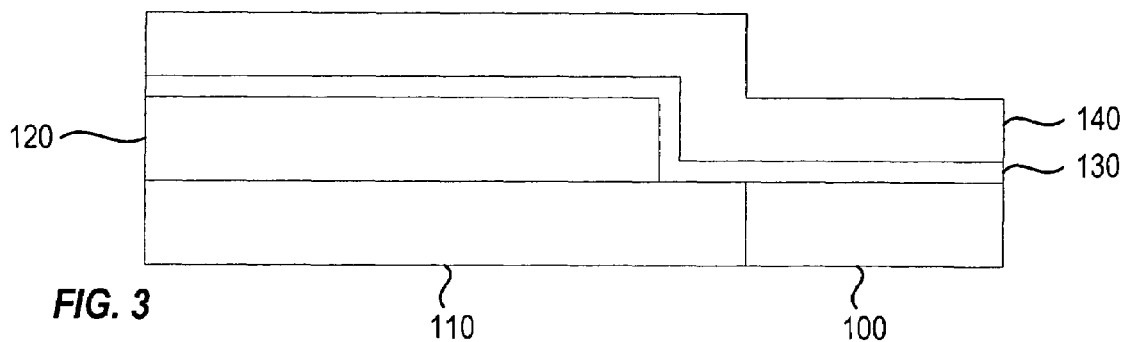
FIG. 3 illustrates the example substrate after a second masking layer is formed over the first masking layer, according to one embodiment.

FIG. 3 illustrates the example substrate after a second masking layer 140 (e.g., nitride) is formed over the oxide layer 130. The nitride layer 140 may be formed through any number of known processes. After the oxide 130 and the nitride layers 140 are formed source drain activation anneal (SDAL) may follow to anneal the nitride layer 140. An annealed nitride layer has a much slower etch rate so that it may be utilized as a hard mask for subsequent etching.

Figure 4:
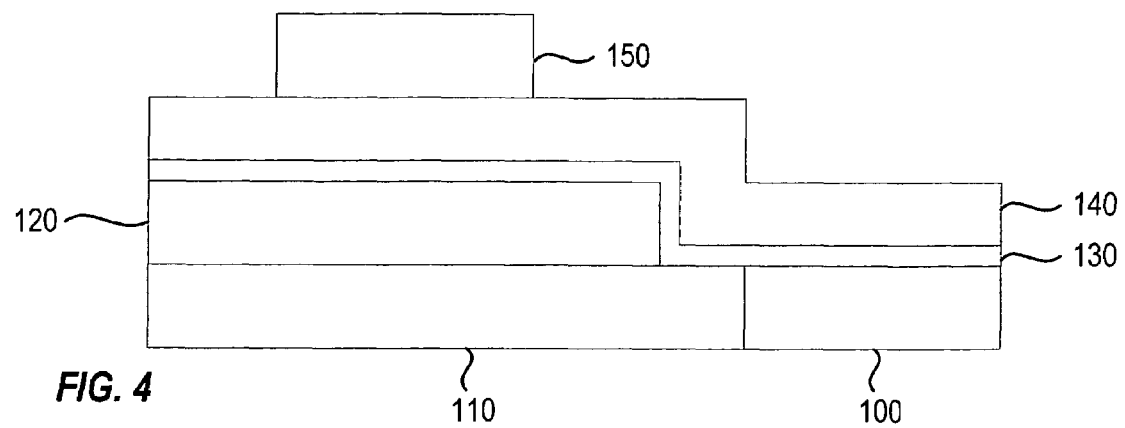
FIG. 4 illustrates the example substrate after a patterning layer is formed and patterned over the second masking layer, according to one embodiment.

FIG. 4 illustrates the example substrate after a patterning layer 150 (e.g., resist) is formed and patterned over the annealed nitride layer 140. The resist layer 150 may be formed and patterned through any number of known processes. For example, the resist layer 150 may be patterned using photolithography.

Figure 5:
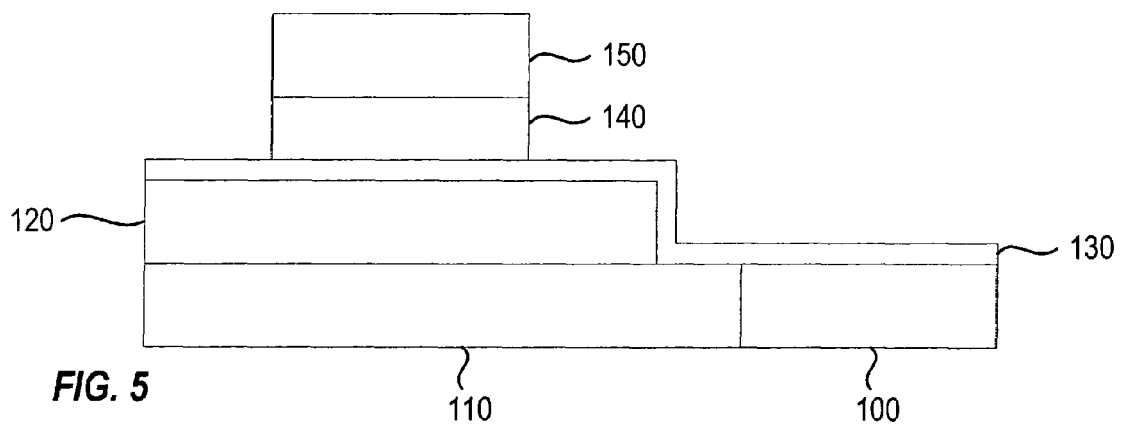
FIG. 5 illustrates the example substrate after the second masking layer is etched using the patterning layer as a pattern, according to one embodiment.

FIG. 5 illustrates the example substrate after the annealed nitride layer 140 is etched using the resist layer 150 as a pattern. The nitride layer 140 may be etched through any number of known processes (e.g., dry etch).

Figure 6:
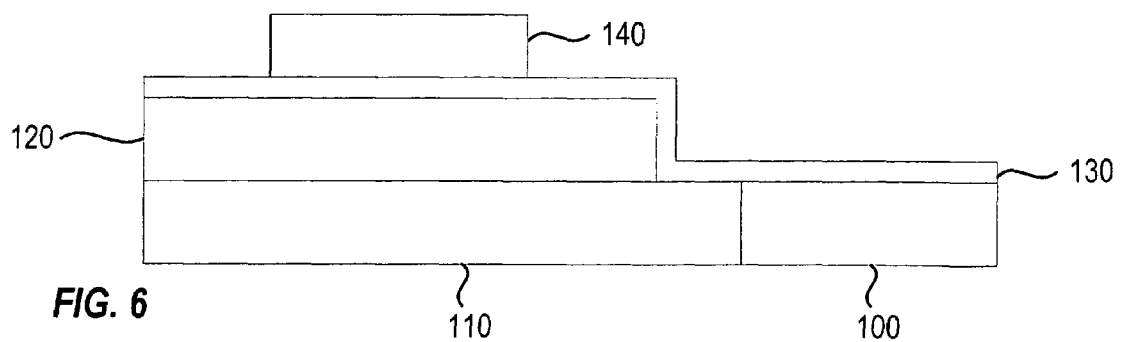
FIG. 6 illustrates the example substrate after the patterning layer is removed, according to one embodiment.

FIG. 6 illustrates the example substrate after the resist layer 150 is removed. The resist layer 150 may be removed through any number of known processes (e.g., ash/clean).

Figure 7:
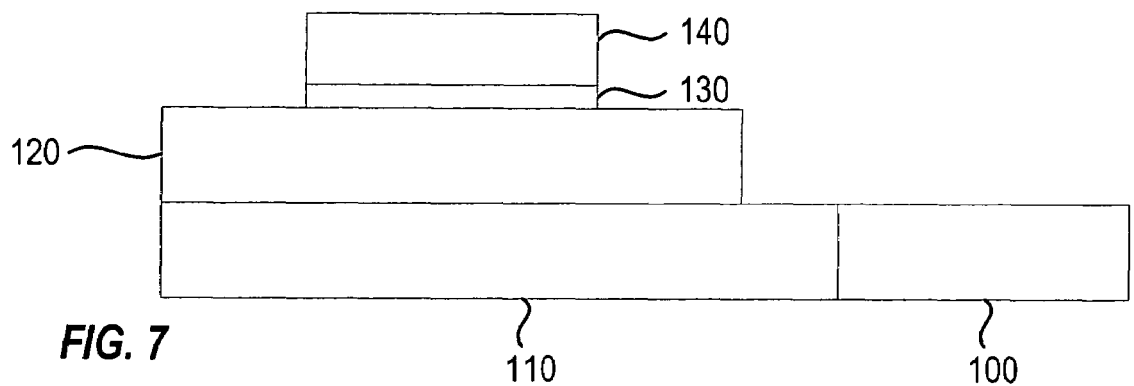
FIG. 7 illustrates the example substrate after the first masking layer is etched using the second masking layer as a pattern, according to one embodiment.

FIG. 7 illustrates the example substrate after the oxide layer 130 is etched using the nitride layer 140 as a pattern. The oxide layer 140 may be etched through any number of known processes (e.g., wet etch).

Figure 8:
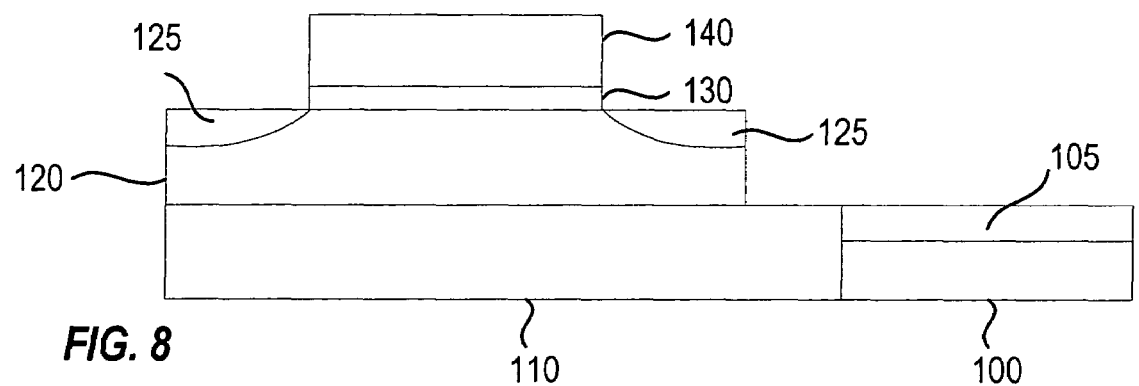
FIG. 8 illustrates the example substrate after germanium pre-amorphization implant (GPI), according to one embodiment.

FIG. 8 illustrates the example substrate after germanium pre-amorphization implant (GPI). The GPI forms an implanted region 105 on top surface of the N+ diffused region 100 and implant regions 125 in the BSR layer 120 on each side of the masking layers 130, 140. Since the resist layer 150 is not utilized as the GPI blocker creation of carbon knock-on is effectively eliminated.

While the embodiments described above focused on the use of a blocking stack made of two layers it is not limited thereto. Rather any number of layers could be utilized without departing from the current scope. Furthermore, the embodiments described focused on the use of oxide as a first layer and nitride as a second layer but is not limited thereto. For example, depending on the etch selectivity of the second layer etch process, the type of first and second layer materials that can be used may include various dielectrics (e.g., SiC, TiN, $TiO_2$).

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. A method comprising
    forming an blocked salicide poly resistor (BSR) region on a semiconductor substrate;
    forming a first masking layer over the substrate including over the BSR region;
    forming a second masking layer over the first masking layer;
    patterning the first and second masking layers to form an implant mask over a center portion of the BSR region;

implanting germanium pre-amorphization into the substrate to form implant regions in the BSR region, wherein the implant regions are formed to each side of the center portion.

2. The method of claim 1, wherein the implant mask is to protect the center portion of the BSR from the implanting.

3. The method of claim 1, wherein the forming a first masking layer includes forming an oxide layer over the substrate.

4. The method of claim 3, wherein the forming a second masking layer includes forming a nitride layer over the first masking layer.

5. A method comprising
forming an blocked salicide poly resistor (BSR) region on a semiconductor substrate;
forming a first masking layer over the substrate;
forming a second masking layer over the first masking layer;
annealing the second masking layer;
patterning the first and second masking layers over the BSR region; and
implanting germanium pre-amorphization into the substrate.

6. The method of claim 5, wherein the patterning includes patterning a resist layer on the second masking layer; and etching the first and second masking layers.

7. The method of claim 6, wherein the etching includes
etching the second masking layer using the resist layer as a pattern;
removing the resist layer; and
etching the first masking layer using the second masking layer as a pattern.

8. The method of claim 7, wherein the etching the second masking layer includes dry etching the second masking layer.

9. The method of claim 7, wherein the etching the first masking layer includes wet etching the first masking layer.

10. A method comprising
forming a semiconductor substrate having an N+ diffusion region, a shallow trench isolation (STI) region adjacent to the N+ diffusion region, and a blocked salicide poly resistor (BSR) region over the STI region;
forming an oxide layer over the substrate;
forming a nitride layer over the oxide layer;
annealing the nitride layer;
patterning a resist layer on the annealed nitride layer, wherein the resist layer covers a portion of the BSR region;
etching the annealed nitride layer using the resist layer as a pattern;
removing the resist layer;
etching the oxide layer using the annealed nitride layer as a pattern; and
implanting germanium pre-amorphization into the substrate, wherein the oxide and the annealed nitride layers protect a portion of the BSR region from the implanting.

11. The method of claim 10, wherein the implanting includes forming implant regions in the BSR region and the N+ diffusion region.

12. The method of claim 10, wherein the etching the annealed nitride layer includes dry etching the annealed nitride layer.

13. The method of claim 10, wherein the etching the oxide layer includes wet etching the oxide layer.

* * * * *